(12) United States Patent
Hashizume

(10) Patent No.: US 7,362,530 B2
(45) Date of Patent: Apr. 22, 2008

(54) AMPLIFIER APPARATUS FOR USE WITH A SENSOR

(75) Inventor: Motomu Hashizume, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 265 days.

(21) Appl. No.: 10/982,624

(22) Filed: Nov. 6, 2004

(65) Prior Publication Data

US 2005/0195512 A1 Sep. 8, 2005

Related U.S. Application Data

(60) Provisional application No. 60/549,375, filed on Mar. 2, 2004.

(51) Int. Cl.
*G11B 5/02* (2006.01)

(52) U.S. Cl. .............................. 360/67; 360/46; 360/66; 360/68

(58) Field of Classification Search ...................... None
See application file for complete search history.

(56) References Cited

U.S. PATENT DOCUMENTS

| | | | | | |
|---|---|---|---|---|---|
| 5,289,136 | A | * | 2/1994 | DeVeirman et al. | 330/252 |
| 5,352,989 | A | * | 10/1994 | Toumazou et al. | 330/265 |
| 5,559,646 | A | * | 9/1996 | Voorman et al. | 360/67 |
| 5,793,551 | A | * | 8/1998 | Ngo et al. | 360/67 |
| 5,834,951 | A | * | 11/1998 | Klein | 327/53 |
| 5,841,603 | A | * | 11/1998 | Ramalho et al. | 360/68 |
| 5,867,062 | A | * | 2/1999 | Kudou | 330/124 R |
| 5,900,779 | A | * | 5/1999 | Giacomini | 330/252 |
| 5,909,024 | A | * | 6/1999 | Voorman et al. | 235/449 |
| 5,990,710 | A | * | 11/1999 | Ngo et al. | 327/110 |
| 6,154,333 | A | * | 11/2000 | Narusawa et al. | 360/67 |
| 6,181,496 | B1 | * | 1/2001 | Price, Jr. | 360/46 |
| 6,188,280 | B1 | * | 2/2001 | Filip | 330/252 |
| 6,211,736 | B1 | * | 4/2001 | Takeuchi et al. | 330/252 |
| 6,331,921 | B1 | * | 12/2001 | Davis et al. | 360/67 |
| 6,366,421 | B2 | * | 4/2002 | Teterud | 360/68 |
| 6,388,476 | B1 | * | 5/2002 | Isobe et al. | 327/110 |
| 6,538,833 | B2 | * | 3/2003 | Choi | 360/46 |
| 6,667,842 | B2 | * | 12/2003 | Comeau et al. | 360/67 |
| 6,721,117 | B2 | * | 4/2004 | Briskin | 360/66 |
| 6,822,817 | B2 | * | 11/2004 | Chung et al. | 360/46 |
| 6,831,799 | B2 | * | 12/2004 | Pakriswamy et al. | 360/67 |
| 6,856,195 | B2 | * | 2/2005 | Ranmuthu | 330/86 |
| 6,870,696 | B2 | * | 3/2005 | Cheung et al. | 360/46 |

(Continued)

*Primary Examiner*—Tan Dinh
*Assistant Examiner*—Dismery Mercedes
(74) *Attorney, Agent, or Firm*—W. James Brady, III; Frederick J. Telecky, Jr.

(57) ABSTRACT

An amplifier apparatus for use with a sensor includes: (a) a first and a second amplifying circuit segment coupled with the sensor and cooperating to effect substantially balanced handling of signals received from the sensor; the first amplifying circuit segment includes a first transistor device; the second amplifying circuit segment includes a second transistor device; (b) a countercurrent unit coupled with the first and second amplifying circuit segments for receiving a first indicator signal from the first transistor device and a second indicator signal from the second transistor device; the first indicator signal represents a first parameter in the first transistor device; the second indicator signal represents a second parameter in the second transistor device; the countercurrent unit provides feedback signals to at least one of the first transistor and second transistor devices to reduce input impedance of the apparatus.

6 Claims, 3 Drawing Sheets

U.S. PATENT DOCUMENTS 7,099,098 B2 * 8/2006 Posat et al. .................. 360/67
2005/0134379 A1 * 6/2005 Boreysha et al. ........... 330/252
2005/0162221 A1 * 7/2005 Barnett et al. .............. 327/563

* cited by examiner

AMPLIFIER APPARATUS FOR USE WITH A SENSOR

This application claims benefit of prior filed copending Provisional Patent Application Ser. No. 60/549,375, filed Mar. 2, 2004.

BACKGROUND OF THE INVENTION

The present invention is directed to signal amplifiers used with a sensor such as a read head in an information storage device, and especially to such signal amplifiers having reduced input impedance.

There are many important goals in designing and operating an amplifier for use with a sensor. One such goal is low band pass corner frequency. Sensors such as magneto-resistive sensing elements require a direct current (DC) bias applied across them to operate correctly. The presence of such a DC bias may cause problems if the DC signal is passed on to amplifying elements. A low band pass corner frequency permits sensing of lower frequency signals while still rejecting DC signals and therefore contributes to a truer sensing of signals indicated by the sensor.

Needs for greater magnetic storage density in industry have been answered by various innovations. One such innovation has been perpendicular magnetic recording in which the magnetic recording medium is magnetized perpendicularly to the film plane of the medium rather than in the plane of the medium. This new technology has occasioned new design challenges. One such challenge has been that when using perpendicular magnetic recording, low corner frequency $f_{LF}$ is preferably about one-tenth the value of low corner frequency $f_{LF}$ values required for longitudinal recording applications where the magnetic recording medium is magnetized substantially in the film plane of the medium.

Prior art signal amplifiers, especially signal amplifiers for use with a read head in an information storage device, have heretofore been difficult to produce economically with low band pass corner frequency $f_{LF}$.

There is a need for a signal amplifier apparatus that accommodates economic design for low band pass corner frequency.

SUMMARY OF THE INVENTION

An amplifier apparatus for use with a sensor includes: (a) a first and a second amplifying circuit segment coupled with the sensor and cooperating to effect substantially balanced handling of signals received from the sensor; the first amplifying circuit segment includes a first transistor device; the second amplifying circuit segment includes a second transistor device; (b) a countercurrent unit coupled with the first and second amplifying circuit segments for receiving a first indicator signal from the first transistor device and a second indicator signal from the second transistor device; the first indicator signal represents a first parameter in the first transistor device; the second indicator signal represents a second parameter in the second transistor device; the countercurrent unit provides feedback signals to at least one of the first transistor and second transistor devices to reduce input impedance of the apparatus.

It is, therefore, an object of the present invention to provide a signal amplifier apparatus that accommodates economic design for low band pass corner frequency.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
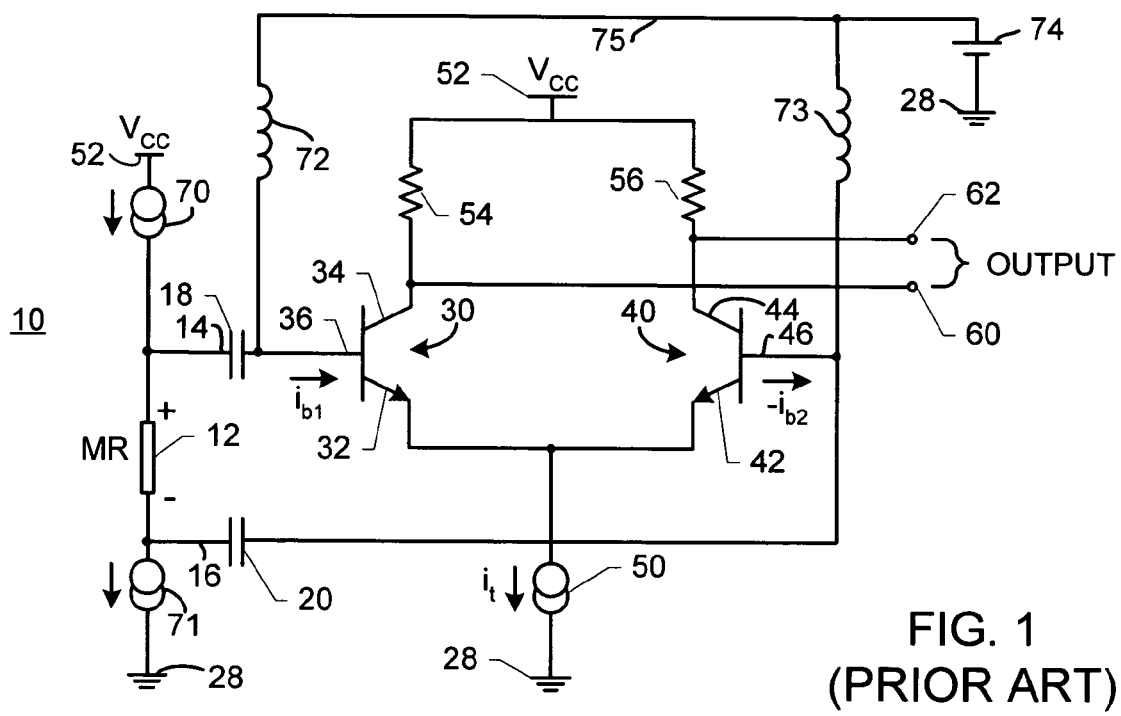
FIG. 1 is an electrical schematic illustration of a prior art differential amplifier for use with a read head.

FIG. 1 is an electrical schematic illustration of a first example of a prior art differential amplifier for use with a read head. In FIG. 1, a read amplifier circuit 10 (sometimes also referred to as a read front-end) is attached to a magneto-resistive element 12 via connection leads 14, 16 connected in parallel. Magneto-resistive element 12 is coupled with a supply voltage $V_{CC}$ at a supply voltage locus 52 via a current source 70. Magneto-resistive element 12 is also coupled with ground 28 (or another potential appropriate to establish the required DC bias for magneto-resistive element 12) via a current source 71. Current sources 70, 71 apply DC (direct current) bias so that flux from a medium being read (not shown in FIG. 1) by magneto-resistive element 12 may be converted to a voltage change or a current change for use by read amplifier circuit 10. A capacitor 18 is coupled with connection lead 14. A capacitor 20 is coupled with connection lead 16. Capacitors 18, 20 block low frequency signals that appear on connection leads 14, 16.

Bipolar Junction Transistor (BJT) 30 has an emitter 32, a collector 34 and a base 36. Bipolar Junction Transistor (BJT) 40 has an emitter 42, a collector 44 and a base 46. Emitters 32, 42 are coupled in common and with a ground locus 28 via a current source 50. Base 36 is coupled with connection lead 14 via capacitor 18. Base 36 is also coupled with ground 28 via a voltage source 74, an electrical lead 75 and an inductor 72. Voltage source 74 and inductor 72 cooperate to perform as a DC voltage source to provide an operating bias at base 36 for transistor 30. Base 46 is connected with connection lead 16 via capacitor 20. Base 46 is also coupled with ground 28 via voltage source 74, an electrical lead 75 and an inductor 73. Voltage source 74 and inductor 73 cooperate to perform as a DC voltage source to provide an operating bias at base 46 for transistor 40. Inductors 72, 73 may be substituted by resistors or current sources (not shown in FIG. 1). One of capacitor of 18, 20 may be omitted in some applications employing read amplifier circuit 10. Collector 34 is coupled with a supply voltage $V_{CC}$ at supply voltage locus 52 via a resistor 54. Collector 44 is coupled with supply voltage $V_{CC}$ at supply voltage locus 52 via a resistor 56. Output signals are taken from collectors 34, 44 and presented at output loci 60, 62.

Amplifier circuit 10 has a band pass frequency range between a lower frequency and an upper frequency within which amplifier circuit 10 has a significantly greater responsiveness than outside that band pass frequency range. If impedances of inductors 72, 73 are sufficiently higher than input impedance of transistors 30, 40, amplifier circuit 10 advantageously permits setting low corner frequency $f_{LF}$ (i.e., the lower frequency limit of the band pass frequency range of amplifier circuit 10) according to the relationship:

$$f_{LF} \sim \frac{1}{2\pi RC} \quad [1]$$

where ~ indicates proportional to;

R is the input impedance of amplifier circuit 10; and

C is the equivalent capacitance of capacitors 18, 20.

Low corner frequency $f_{LF}$ is commonly determined by varying the value of C in expression [1]. A larger value for C will reduce the value of low corner frequency $f_{LF}$.

When flux from a medium being read (not shown in FIG. 1) by magneto-resistive element 12 produces a read-out voltage across magneto-resistive element 12 having a polarity as indicated in FIG. 1, a small signal current $i_{b1}$ flows in the direction indicated in FIG. 1 into base 36 of transistor 30, and a small signal current $i_{b2}$ flows in the direction indicated in FIG. 1 out of base 46 of transistor 40. When read-out signal voltage across magneto-resistive element 12 has a polarity opposite to the polarity indicated in FIG. 1, small signal currents $i_{b1}$, $i_{b2}$ flow in directions opposite to directions illustrated in FIG. 1.

Input impedance of apparatus 10 is inversely proportional to BJT (bipolar junction transistor) base currents $i_{b1}$, $i_{b2}$. Base currents $i_{b1}$, $i_{b2}$ are determined by tail current $i_t$ at current source 50 and β of BJT transistors 30, 40. Tail current $i_t$ is chosen to minimize noise in apparatus 10, and such choices have typically resulted in C (expression [1]) having a value of about 100 picoFarads (pf) to achieve a 1 megaHertz low corner frequency. Such operational parameters have sufficed for use in longitudinal recording applications.

Needs for greater magnetic storage density in industry have been answered by various innovations. One such innovation has been perpendicular magnetic recording in which the magnetic recording medium is magnetized perpendicularly to the film plane of the medium rather than in the plane of the medium. This new technology has occasioned new design challenges. One such challenge has been that when using perpendicular magnetic recording, low corner frequency $f_{LF}$ is preferably about one-tenth the value of low corner frequency $f_{LF}$ values required for longitudinal recording applications. Inspection of expression [1] reveals that there are two straightforward ways to alter low corner frequency $f_{LF}$.

One may increase the value of C by ten times to set low corner frequency $f_{LF}$ at one-tenth its beginning value (that is, the value of C which is useful for longitudinal recording applications). There is a problem with this solution because increasing the value of C to such an amount would require significantly greater silicon area for its implementation. In these days of smaller packages for smaller products, such an increase in required area is not an attractive design solution.

Another approach to set low corner frequency $f_{LF}$ at one-tenth its beginning value is to use high β transconductance transistors for transistors 30, 40 (FIG. 1) to effect an increase in input impedance of apparatus 10 (FIG. 1). However, such a design approach requires introducing special processing and contributes to noise characteristics of apparatus 10. Higher input impedance could be achieved by using Metal Oxide Silicon (MOS) transistors for transistors 30, 40. However, noise increase due to lower conductance of MOS transistors as compared with BJT transistors, and difficulties in matching MOS transistors would add complexity to manufacturing such a modified apparatus.

Increasing input impedance for an amplifier such as apparatus 10 (FIG. 1) may be achieved by using the present invention, as described in connection with FIGS. 2 and 3.

Figure 2:
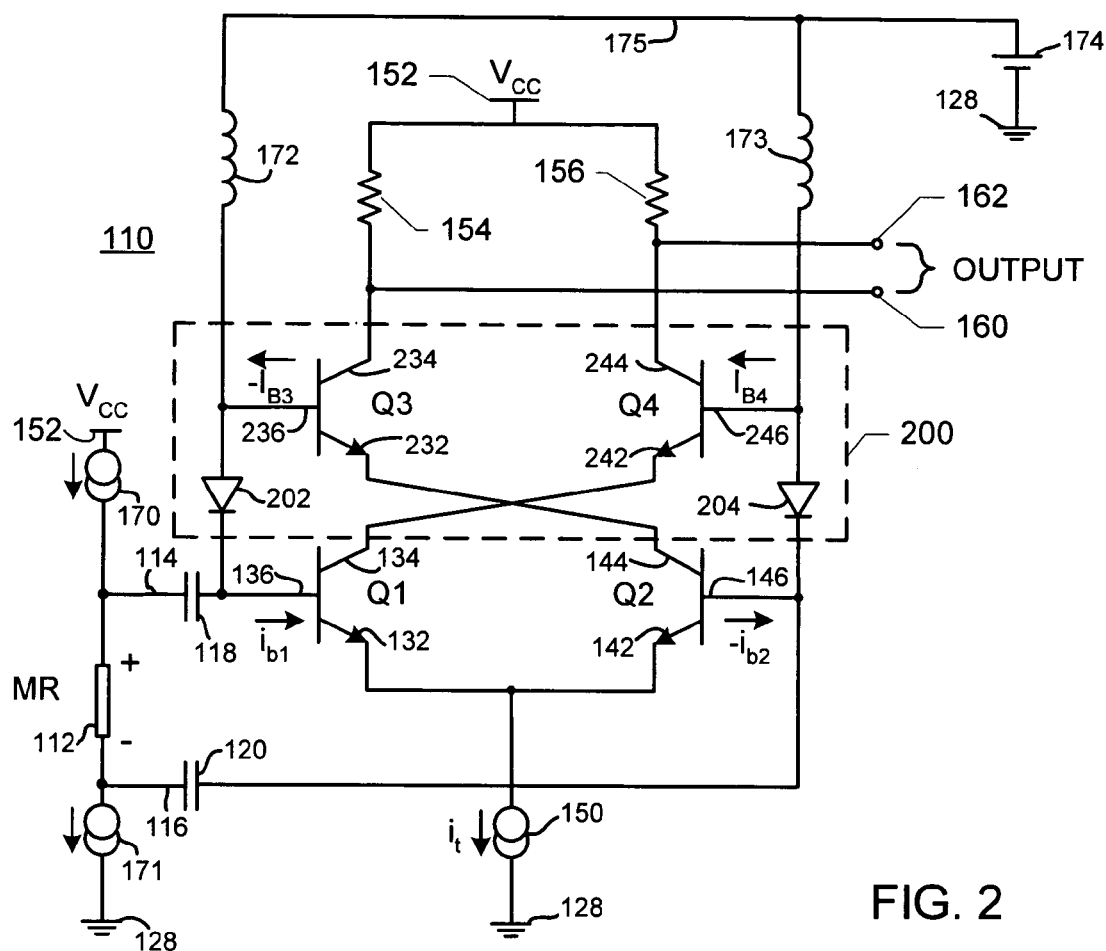
FIG. 2 is an electrical schematic illustration of a first embodiment of the differential amplifier of the present invention.

FIG. 2 is an electrical schematic illustration of a first embodiment of the differential amplifier of the present invention. In FIG. 2, a read amplifier circuit 110 is attached to a magneto-resistive element 112 via connection leads 114, 116 connected in parallel. Magneto-resistive element 112 is coupled with a supply voltage $V_{CC}$ at a supply voltage locus 152 via a current source 170. Magneto-resistive element 112 is also coupled with ground 128 (or another potential appropriate to establish the required DC bias for magneto-resistive element 112) via a current source 171. Current sources 170, 171 apply DC (direct current) bias so that flux from a medium being read (not shown in FIG. 2) by magneto-resistive element 112 may be converted to a voltage change or a current change for use by read amplifier circuit 110. A capacitor 118 is coupled with connection lead 114. A capacitor 120 is coupled with connection lead 116. Capacitors 118, 120 block low frequency signals that appear on connection leads 114, 116.

Bipolar Junction Transistor (BJT) Q1 has an emitter 132, a collector 134 and a base 136. Bipolar Junction Transistor (BJT) Q2 has an emitter 142, a collector 144 and a base 146. Emitters 132, 142 are coupled in common and with a ground locus 128 via a current source 150. Base 136 is coupled with connection lead 114 via capacitor 118 and base 146 is connected with connection lead 116 via capacitor 120.

A countercurrent unit 200 includes BJT Q3, Q4. Bipolar Junction Transistor (BJT) Q3 has an emitter 232, a collector 234 and a base 236. Bipolar Junction Transistor (BJT) Q4 has an emitter 242, a collector 244 and a base 246.

Collector 234 is coupled with a supply voltage $V_{CC}$ at supply voltage locus 152 via a resistor 154. Collector 244 is coupled with supply voltage $V_{CC}$ at supply voltage locus 152 via a resistor 156. Output signals are taken from collectors 234, 244 and presented at output loci 160, 162.

Emitter 232 is coupled with collector 144. Emitter 242 is coupled with collector 134. A diode 202 couples base 236 with base 136, and a diode 204 couples base 246 with base 146. Base 236 is also coupled with ground 128 via a voltage source 174, an electrical lead 175 and an inductor 172. Voltage source 174 and inductor 172 cooperate to perform as a DC voltage source to provide an operating bias at base 236 for transistor Q3 and, via diode 202, at base 136 for transistor Q1. Base 246 is also coupled with ground 128 via voltage source 174, an electrical lead 175 and an inductor 173. Voltage source 174 and inductor 173 cooperate to perform as a DC voltage source to provide an operating bias at base 246 for transistor Q4 and, via diode 204, at base 146 for transistor Q2. Inductors 172, 173 may be substituted by resistors or current sources (not shown in FIG. 2). One of capacitor of 118, 120 may be omitted in some applications employing read amplifier circuit 110.

Amplifier circuit 110 has a band pass frequency range between a lower frequency and an upper frequency within which amplifier circuit 110 has a significantly greater responsiveness than outside that frequency range.

If impedances of inductors 172, 173 are sufficiently higher than input impedance of transistors Q1, Q2, Q3, Q4, amplifier circuit 110 advantageously permits setting low corner frequency $f_{LF}$ (i.e., the lower frequency limit of the band pass frequency range of amplifier circuit 110) according to the relationship set forth in expression [1] above.

When flux from a medium being read (not shown in FIG. 1) by magneto-resistive element 112 produces a read-out voltage across magneto-resistive element 112 having a polarity as indicated in FIG. 2, a small signal current $i_{b1}$ flows in the direction indicated in FIG. 2 into base 136 of transistor Q1, and a small signal current $i_{b2}$ flows in the direction indicated in FIG. 2 out of base 146 of transistor Q2. When read-out signal voltage across magneto-resistive element 112 has a polarity opposite to the polarity indicated in FIG. 2, small signal currents $i_{b1}$, $i_{b2}$ flow in directions opposite to directions illustrated in FIG. 2.

Figure 3:
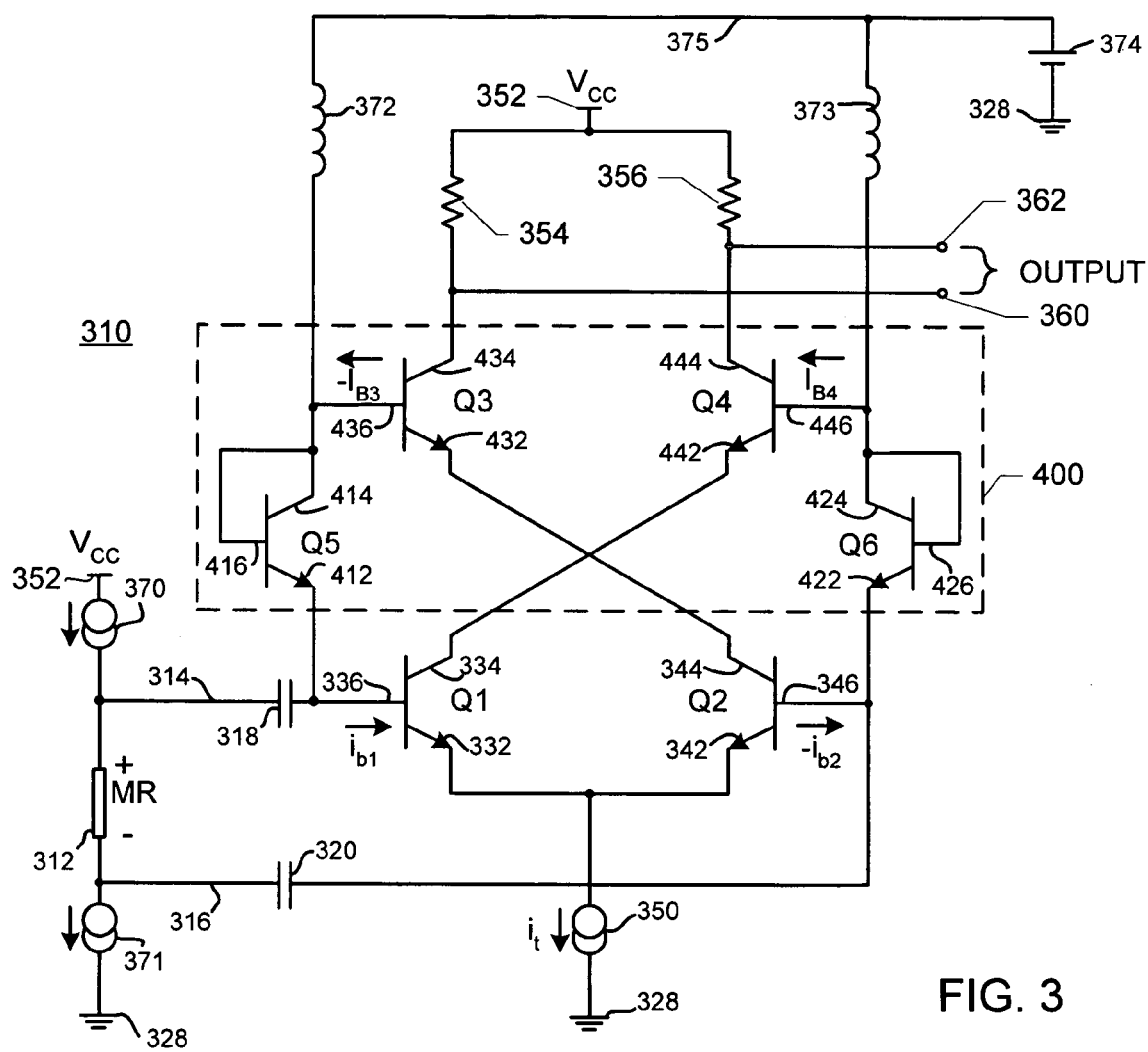
FIG. 3 is an electrical schematic illustration of the preferred embodiment of the differential amplifier of the present invention.

FIG. 3 is an electrical schematic illustration of the preferred embodiment of the differential amplifier of the present invention. In FIG. 3, a read amplifier circuit 310 (sometimes also referred to as a read front-end) is attached to a magneto-resistive element 312 via connection leads 314, 316 connected in parallel. Magneto-resistive element 312 is coupled with a supply voltage $V_{CC}$ at a supply voltage locus 352 via a current source 370. Magneto-resistive element 312 is also coupled with ground 328 (or another potential appropriate to establish the required DC bias for magneto-resistive element 312) via a current source 371. Current sources 370, 371 apply DC (direct current) bias so that flux from a medium being read (not shown in FIG. 3) by magneto-resistive element 312 may be converted to a voltage change or a current change for use by read amplifier circuit 310. A capacitor 318 is coupled with connection lead 314. A capacitor 320 is coupled with connection lead 316. Capacitors 318, 320 block low frequency signals that appear on connection leads 314, 316.

Bipolar Junction Transistor (BJT) Q1 has an emitter 332, a collector 334 and a base 336. Bipolar Junction Transistor (BJT) Q2 has an emitter 342, a collector 344 and a base 346. Emitters 332, 342 are coupled in common and with a ground locus 328 via a current source 350. Base 336 is coupled with connection lead 314 via capacitor 318 and base 346 is connected with connection lead 316 via capacitor 320.

A countercurrent unit 400 includes BJTs Q3, Q4. Bipolar Junction Transistor (BJT) Q3 has an emitter 432, a collector 434 and a base 436. Bipolar Junction Transistor (BJT) Q4 has an emitter 442, a collector 444 and a base 446.

Collector 434 is coupled with a supply voltage $V_{CC}$ at supply voltage locus 352 via a resistor 354. Collector 444 is coupled with supply voltage $V_{CC}$ at supply voltage locus 352 via a resistor 356. Output signals are taken from collectors 434, 444 and presented at output loci 360, 362. Emitter 432 is coupled with collector 344. Emitter 442 is coupled with collector 334.

BJTs Q5, Q6 are diode-coupled. BJT Q5 has an emitter 412, a collector 414 and a base 416. Base 416 is coupled with collector 414 to establish diode coupling. BJT Q6 has an emitter 422, a collector 424 and a base 426. Base 426 is coupled with collector 424 to establish diode coupling. BJT Q5 couples base 436 with base 336, and BJT Q6 couples base 446 with base 346.

Base 436 is also coupled with ground 328 via a voltage source 374, an electrical lead 375 and an inductor 372. Voltage source 374 and inductor 372 cooperate to perform as a DC voltage source to provide an operating bias at base 436 for transistor Q3 and, via transistor Q5, at base 336 for transistor Q1. Base 446 is also coupled with ground 328 via voltage source 374, an electrical lead 375 and an inductor 373. Voltage source 374 and inductor 373 cooperate to perform as a DC voltage source to provide an operating bias at base 446 for transistor Q4 and, via transistor Q6, at base 346 for transistor Q2. Inductors 372, 373 may be substituted by resistors or current sources (not shown in FIG. 3). One of capacitor of 318, 320 may be omitted in some applications employing read amplifier circuit 310.

Amplifier circuit 310 has a band pass frequency range between a lower frequency and an upper frequency within which amplifier circuit 310 has a significantly greater responsiveness than outside that frequency range. If impedances of inductors 372, 373 are sufficiently higher than input impedance of transistors Q1, Q2, Q3, Q4, amplifier circuit 310 advantageously permits setting low corner frequency $f_{LF}$ (i.e., the lower frequency limit of the band pass frequency range of amplifier circuit 310) according to the relationship set forth in expression [1] above.

When flux from a medium being read (not shown in FIG. 3) by magneto-resistive element 312 produces a read-out voltage across magneto-resistive element 312 having a polarity as indicated in FIG. 3, a small signal current $i_{b1}$ flows in the direction indicated in FIG. 3 into base 336 of transistor Q1, and a small signal current $i_{b2}$ flows in the direction indicated in FIG. 3 out of base 346 of transistor Q2. When read-out signal voltage across magneto-resistive element 312 has a polarity opposite to the polarity indicated in FIG. 3, small signal currents $i_{b1}$, $i_{b2}$ flow in directions opposite to directions illustrated in FIG. 3.

Apparatus 110 (FIG. 2) and apparatus 310 (FIG. 3) operate substantially the same because diodes 202, 204 and BJTs Q5, Q6 participate in substantially the same way in their respective apparatuses 110, 310. In order to avoid prolixity, only operation of apparatus 110 will be described herein.

Referring to FIG. 2, flux from a medium being read (not shown in FIG. 2) by magneto-resistive element 112 produces a read-out voltage across magneto-resistive element 112 having a polarity as indicated in FIG. 2, small signal base current $i_{b1}$ flows into BJT Q1 (as shown in FIG. 2). BJT Q1 is thus conductive and current flows from emitter 132, through collector 134, through emitter 242 and collector 244 to output locus 162. Those conditions cause small signal current $i_{b4}$ to flow into base 246 in a direction as indicated in FIG. 2. The read-out signal voltage across magneto-resistive element 112 also causes small signal base current $i_{b2}$ to flow out of BJT Q2 (as shown in FIG. 2). BJT Q2 thus establishes a current flow from collector 234, through base 236, through diode 202 to base 136. These conditions cause small signal current $i_{b3}$ to flow out of base 236 in a direction as indicated in FIG. 2. Small signal currents $i_{b2}$, $i_{b4}$ are both provided to capacitor 120 so that the sum of currents at capacitor 120 is substantially reduced from base current $i_{b2}$. Small signal currents $i_{b1}$, $i_{b3}$ are both provided to capacitor 118 so that the sum of currents at capacitor 118 is substantially reduced from small signal current $i_{b1}$.

When flux from a medium being read (not shown in FIG. 2) by magneto-resistive element 112 produces a read-out voltage across magneto-resistive element 112 having a polarity opposite to the polarity indicated in FIG. 2, base current $i_{b2}$ flows into BJT Q2, and current flows from emitter 142, through collector 144, through emitter 232 and collector 234 to output locus 160. Those conditions cause a small signal current $i_{b3}$ to flow into base 236. The read-out signal voltage across magneto-resistive element 112 also causes small signal base current $i_{b1}$ to flow out of BJT Q1. BJT Q1 thus establishes a current flow from collector 244, through base 246, through diode 204 to base 146. These conditions cause a small signal current $i_{b4}$ to flow out of base 246.

Whatever the polarity of read-out signal voltage across magneto-resistive element 112, small signal currents $i_{b2}$, $i_{b4}$ are both provided to capacitor 120 so that the sum of small signal currents at capacitor 120 is substantially reduced from small signal current $i_{b2}$. Small signal currents $i_{i1}$, $i_{b3}$ are both provided to capacitor 118 so that the sum of small signal currents at capacitor 118 is substantially reduced from small signal current $i_{b1}$. BJT small signal base currents $i_{b1}$, $i_{b2}$, $i_{b3}$, $i_{b4}$ may vary due to mismatches during manufacturing. Such variances are usually less than 10% variation from design criteria applicable number, so at most about $\frac{1}{10}$ of capacitor current will be realized at capacitors 118, 120 than would be present without offsetting currents $i_{i3}$, $i_{b4}$.

An important result is that the small signal currents at capacitors 118, 120 available to drive BJTs Q1, Q2 are reduced. Input impedance of apparatus 110 is inversely proportional to the BJT base currents $i_{b1}$, $i_{b2}$. Base currents $i_{b1}$, $i_{b2}$ are determined by tail current $i_t$ at current source 150 and β of BJTs Q1, Q2. Base currents $i_{b1}$, $i_{b2}$ are canceled out by base currents $i_{b3}$, $i_{b4}$ which involve similar current amounts but opposite current direction with respect to base currents $i_{b1}$, $i_{b2}$. Input impedance of apparatus 110 is thereby increased.

Referring to expression [1], one may observe that increasing input impedance to apparatus 110 (i.e., increasing R in expression [1]), one may reduce low corner frequency $f_{LF}$ without the disadvantages that attend increasing C or using MOS transistors or requiring special processing in manufacturing apparatus 110, as discussed hereinabove in connection with FIG. 1. Such disadvantages include increased silicon area to accommodate a larger capacitor to increase C in expression [1], special processes to incorporate high β transconductance transistors to increase input impedance of apparatus 110 or using Metal Oxide Silicon (MOS) transistors which would add complexity to manufacturing.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. A differential amplifier, comprising:
   (a) first and second bipolar transistors connected as an input differential pair with their emitters connected together and to a current source;
   (b) first and second loads for said first and second transistor collectors, respectively, and a differential output at said first and second loads; and
   (c) third and fourth transistors, where said third transistor connects between said second transistor collector and said second load and said fourth transistor connects between said first transistor collector and said first load, and where a base of said third transistor couples to a base of said first transistor and a base of said fourth transistor couples to a base of said second transistor;
   (d) whereby input resistance of said differential amplifier is increased due to said coupled first and third bases and said coupled second and fourth bases, wherein said first and third bases are connected by a first diode and said second and fourth bases are connected by a second diode; whereby the direction of differential-signal induced base current at said first transistor is opposite the direction of differential-signal induced base current at said third transistor and thereby providing an increased differential-signal input resistance for said differential amplifier.

2. The differential amplifier of claim 1, wherein said first diode and said second diode are each a diode-connected bipolar transistor.

3. The differential amplifier of claim 1, wherein said first diode is part of a bias circuit for said first and third transistors, and said second diode is part of a bias circuit for said second and fourth transistors.

4. A magneto-resistive read head system, comprising:
   (a) a bias circuit for connection to magneto-resistive read head terminals;
   (b) a differential amplifier with inputs coupled to said magneto-resistive read head terminals, said differential amplifier including:
      (i) first and second bipolar transistors connected as an input differential pair with their emitters connected together and to a current source;
      (ii) first and second loads for said first and second transistor collectors, respectively, and a differential output at said first and second loads; and
      (iii) third and fourth transistors, where said third transistor connects between said second transistor collector and said second load and said fourth transistor connects between said first transistor collector and said first load, and where a base of said third transistor couples to a base of said first transistor and a base of said fourth transistor couples to a base of said second transistor, wherein said first and third bases are connected by a first diode and said second and fourth bases are connected by a second diode; whereby the direction of differential-signal induced base current at said first transistor is opposite the direction of differential-signal induced base current at said third transistor and thereby providing an increased differential-signal input resistance for said differential amplifier.

5. The magneto-resistive read head system of claim 4, wherein said first diode and said second diode are each a diode-connected bipolar transistor.

6. The magneto-resistive read head system of claim 4, wherein said first diode is part of a bias circuit for said first and third transistors, and said second diode is part of a bias circuit for said second and fourth transistors.

* * * * *